(12) United States Patent
Lee et al.

(10) Patent No.: US 9,178,474 B2
(45) Date of Patent: Nov. 3, 2015

(54) FEEDBACK AMPLIFIER

(71) Applicant: Electronics and Telecommunications Research Institute, Daejeon (KR)

(72) Inventors: Sang-Heung Lee, Daejeon (KR); Seong-il Kim, Daejeon (KR); Dong Min Kang, Daejeon (KR); Jong-Won Lim, Daejeon (KR); Chull Won Ju, Daejeon (KR); Hyung Sup Yoon, Daejeon (KR); Jae Kyoung Mun, Daejeon (KR); Eun Soo Nam, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 97 days.

(21) Appl. No.: 13/950,895

(22) Filed: Jul. 25, 2013

(65) Prior Publication Data

US 2014/0184333 A1  Jul. 3, 2014

(30) Foreign Application Priority Data

Jan. 2, 2013  (KR) ........................ 10-2013-0000317

(51) Int. Cl.
| | |
|---|---|
| *H03F 3/08* | (2006.01) |
| *H03G 1/00* | (2006.01) |
| *H03G 3/02* | (2006.01) |
| *H03G 11/02* | (2006.01) |
| *H03G 3/30* | (2006.01) |

(52) U.S. Cl.
CPC ............... *H03F 3/08* (2013.01); *H03G 1/0047* (2013.01); *H03G 1/0088* (2013.01); *H03G 3/02* (2013.01); *H03G 3/3084* (2013.01); *H03G 11/02* (2013.01)

(58) Field of Classification Search
CPC ............... H03F 3/45; H03F 3/08; H03G 3/02; H03G 1/0088; H03G 1/0047; H03G 11/02
USPC ............ 330/86, 308, 59, 110, 277–278, 282; 250/214 A
See application file for complete search history.

(56) References Cited

U.S. PATENT DOCUMENTS

| | | | |
|---|---|---|---|
| 5,952,887 A * | 9/1999 | Katayanagi et al. | 330/308 |
| 6,404,282 B2 * | 6/2002 | Kikuchi et al. | 330/86 |
| 7,157,977 B2 | 1/2007 | Lee et al. | |
| 7,268,628 B2 * | 9/2007 | Noda | 330/308 |
| 8,841,969 B2 * | 9/2014 | Lee et al. | 330/282 |
| 2008/0284520 A1 * | 11/2008 | Prikhodko et al. | 330/291 |

FOREIGN PATENT DOCUMENTS

| | | | | |
|---|---|---|---|---|
| JP | 57-194613 A | | 11/1982 | |
| KR | 10-0802518 | * | 2/2008 | ............... H03F 3/45 |
| KR | 10-0802518 B1 | | 2/2008 | |

* cited by examiner

*Primary Examiner* — Steven J Mottola
*Assistant Examiner* — Hafizur Rahman
(74) *Attorney, Agent, or Firm* — Rabin & Berdo, P.C.

(57) ABSTRACT

Provided is a feedback amplifier. The feedback amplifier includes: an amplification circuit unit amplifying a burst packet signal inputted from an input terminal and outputting the amplified voltage to an output terminal; a feedback circuit unit disposed between the input terminal and the output terminal and controlling whether to apply a fixed resistance value to a signal outputted to the output terminal; a packet signal detection unit detecting a peak value of a burst packet signal from the output terminal and controlling whether to apply the fixed resistance value; and a bias circuit unit generating a bias voltage, wherein the feedback circuit unit determines a feedback resistance value to change the fixed resistance value in response to at least one control signal and adjusts a gain by receiving the bias voltage.

10 Claims, 5 Drawing Sheets

FEEDBACK AMPLIFIER

CROSS-REFERENCE TO RELATED APPLICATIONS

This U.S. non-provisional patent application claims priority under 35 U.S.C. §119 of Korean Patent Application No. 10-2013-0000317, filed on Jan. 2, 2013, the entire contents of which are hereby incorporated by reference.

BACKGROUND OF THE INVENTION

The present invention disclosed herein relates to an optical communication system, and more particularly, to a feedback amplifier for receiving an input signal regardless of the size of the input signal.

An optical access network evolves into the form of an optical multiple access using a passive optical network (PON). Such a passive optical network system uses an optical signal in a burst mode. An optical signal in the burst mode changes drastically and abruptly when a packet in one channel switches into a packet in another channel. Accordingly, an optical receiver requires a high reception sensitivity in addition to a wide dynamic range. A preamplifier is disposed at the first state where a signal is inputted in the optical receiver and the performance of the preamplifier is determined depending on the performance of a feedback amplifier.

In this way, the feedback amplifier used in the preamplifier detects a burst packet input signal and includes an amplifier circuit for amplification. A feedback circuit is provided in the feedback amplifier to detect the peak value of a burst packet input signal, and control the level of an output voltage of a detected signal. Here, the feedback circuit includes a feedback resistor connected between an input terminal and an output terminal and a feedback transistor connected in parallel to the feedback resistor. Here, the feedback transistor controls a current flowing through the feedback circuit and an output voltage when a control signal is applied to the base.

In this way, the feedback amplifier detects a burst packet input signal with a voltage level. However, if the voltage level of a burst packet input signal is very low, the feedback amplifier may not detect the burst packet input signal.

Moreover, a method of applying a control signal to the base of a feedback transistor includes a method of generating a control signal by configuring an additional gain control signal generating circuit outside a feedback amplifier and a method of self-generating a control signal by positioning a bias circuit in a feedback amplifier. However, since a control signal changes in response to an input signal, if there is a great difference between input signals, the gain of a preamplifier may not be freely adjusted.

SUMMARY OF THE INVENTION

The present invention provides a feedback amplifier capable of detecting a small size of an input signal.

The present invention provides a feedback amplifier capable of adjusting a gain when a difference between input signals is great.

Embodiments of the present invention provide feedback amplifiers including: an amplification circuit unit amplifying a burst packet signal inputted from an input terminal and outputting the amplified voltage to an output terminal; a feedback circuit unit disposed between the input terminal and the output terminal and controlling whether to apply a fixed resistance value to a signal outputted to the output terminal; a packet signal detection unit detecting a peak value of a burst packet signal from the output terminal and controlling whether to apply the fixed resistance value; and a bias circuit unit generating a bias voltage, wherein the feedback circuit unit determines a feedback resistance value to change the fixed resistance value in response to at least one control signal and adjusts a gain by receiving the bias voltage.

In some embodiments, the feedback circuit unit may include: a feedback transistor where a base receives the bias voltage, a collector is connected to the input terminal, and an emitter is connected to the output terminal; and a feedback resistance unit connected in parallel to the feedback transistor.

In other embodiments, the feedback resistance unit may include: a fixed resistor connected between the input terminal and the output terminal; and at least one feedback resistor connected in parallel to the fixed resistor.

In still other embodiments, the feedback amplifier may further include at least one switch transistor connected in series to the feedback resistor and selectively connecting a feedback resistor in parallel to the fixed resistor through a turn on/off operation in response to a control signal inputted through a base.

In even other embodiments, the feedback resistance unit may be connected in parallel to the at least one feedback capacitor to compensate for a frequency response.

In yet other embodiments, the packet signal detection unit may include: a detection diode detecting a peak value of a burst packet signal of the output node; a detection NAND gate receiving the detected peak value and a detection reference voltage and outputting a NAND operation result through a NAND operation; and a detection transistor connected in parallel to the fixed resistor and performs one of an on operation and an off operation according to the NAND operation result to control the fixed resistance value.

In further embodiments, the packet signal detection unit may include: a detection capacitor connected between an output the detection diode and a ground terminal to maintain the detected peak value; and a detection resistor connected between the output of the detection diode and the ground terminal to maintain the detected peak value.

In still further embodiments, the bias circuit unit may include: a first bias resistor connected to a ground terminal; a first bias transistor where a base and a collector are commonly connected to the base of the feedback transistor to provide the bias voltage, and an emitter is connected to the ground terminal through the first bias resistor; and a second bias transistor receiving the bias voltage; and a second bias transistor where an emitter is connected to the collector of the first bias transistor, a base is connected to the collector, and the collector is connected to the second bias resistor.

In even further embodiments, the amplification circuit unit may include: a first resistor connected to a power supply voltage; a first transistor where a base is connected to the input terminal, an emitter is connected to a ground terminal, and a collector is connected to the power supply voltage through the first resistor; a second transistor where a base is connected to the collector of the first transistor, a collector is connected to the power supply voltage, and an emitter is connected to the output terminal; and a second resistor connected between the output terminal and the ground terminal.

In yet further embodiments, the feedback amplifier may further include a phase compensation circuit unit preventing a distortion of an output waveform according to an increase of an amount in feedback current, between the amplification circuit unit and the bias circuit unit.

In yet further embodiments, the phase compensation circuit unit may include a compensation transistor where a collector is connected to a power supply voltage, a base is connected to the collector of the second bias transistor, and an emitter is connected to the collector of the first transistor.

In yet further embodiment, the feedback amplifier may further include a control signal generating unit generating the at least one control signal on the basis of a comparison result of an output voltage of the output terminal and a comparison reference voltage.

In yet further embodiment, the control signal generating unit may include at least one comparator receiving the output voltage of the output terminal and the comparison reference voltage, generating a control signal in a low state when the output voltage is greater than the comparison reference voltage, and generating the control signal in a high state when the output voltage is less than the comparison reference voltage.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

The present invention provides a feedback amplifier, as an optical communication system, adjusting a gain regardless of the size of an input signal in a passive optical network (PON) system. For example, a feedback amplifier may be disposed in an optical receiver.

Figure 1:
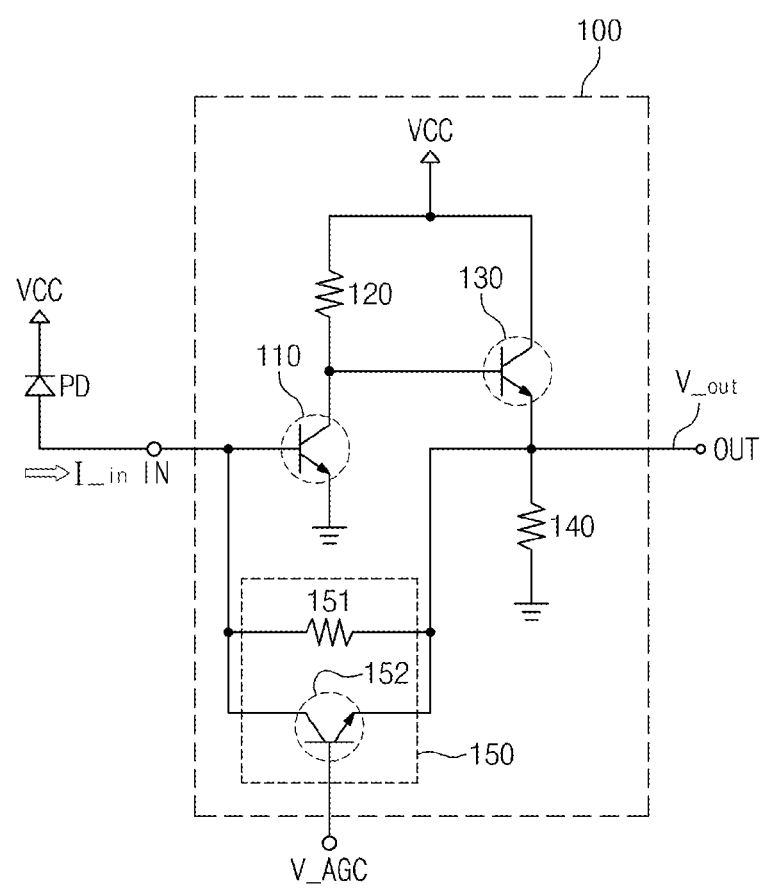
FIG. 1 is a schematic view of a typical feedback amplifier.

FIG. 1 is a schematic view of a typical feedback amplifier.

Referring to FIG. 1, a first feedback amplifier 100 is connected between an input terminal IN and an output terminal OUT. The input terminal IN is connected to a light receiving device connected to a power, that is, a photo diode (PD). An input current I_in corresponding to a cathode current of the PD is supplied to the input terminal N.

The first feedback amplifier 100 includes a first NPN transistor 110, a first resistor 120, a second NPN transistor 130, a second resistor 140, and a feedback circuit 150.

The base of the first NPN transistor 110 is connected to the input terminal N. The collector of the first NPN transistor 110 is connected to a power VCC through the first resistor 120, and is connected to the base of the second NPN transistor 130. The emitter of the first NPN transistor 110 is connected to a ground terminal.

The collector of the second NPN transistor 130 is connected to the power VCC. The emitter of the second NPN transistor 130 is connected to the output terminal OUT, and is connected to the ground terminal through the second resistor 140.

The feedback circuit 150 includes a feedback resistor 151 and a feedback transistor 152.

The feedback resistor 151 is connected between the base of the first NPN transistor 110 and the output terminal OUT.

The collector of the feedback transistor 152 is connected to the base of the first NPN transistor 110. The emitter of the feedback transistor 152 is connected to the output terminal OUT. A control signal V_AGC is applied from an external circuit (not shown) to the base of the feedback transistor 152 in order to control feedback current.

The first feedback amplifier 100 detects a voltage level with a burst packet input signal (hereinafter, referred to as an input signal). Accordingly, if a small input signal that the first feedback amplifier 100 cannot detect with a voltage level is inputted, amplification may not be performed.

Additionally, in relation to the first feedback amplifier 100, when the control signal V_AGC of a low voltage is applied to the base of the feedback transistor 152, the feedback transistor 152 is in an off state. Therefore, the feedback transistor 152 is regarded as equivalent to an open state and the transimpedance is regarded as identical to the resistance value of the feedback resistor 151.

When the level of the control signal V_AGC increases, since the feedback transistor 152 is turned on, the impedance between the collector and emitter of the feedback transistor 152. The feedback resistor 152 is connected in parallel to the feedback transistor 152. Accordingly, as the impedance of the feedback transistor 152 is reduced, a feedback resistance and transimpedance are reduced.

Accordingly, the gain of the first feedback amplifier 100 is controlled in response to the control signal V_AGC. That is, in relation to the first feedback amplifier 100, when the control signal V_AGC is changed in response to the input current I_in, it is determined based on the input current I_in within a range where the output voltage V_out is not saturated. An additional gain control signal generating circuit needs to be configured to supply a proper size of the control signal V_AGC. Also, the gain control signal generating circuit supplies the control signal V_AGC to the first feedback amplifier 100. Since gain is adjusted by using only the turn-on resistance of the feedback transistor 152, if a difference between input signals is great, the gain may not be freely adjusted.

Accordingly, referring to FIGS. 2 to 5, suggested are feedback amplifiers capable of detecting a signal even when the size of an input signal is small and freely adjusting gain even when a difference between input signals is great.

Figure 2:
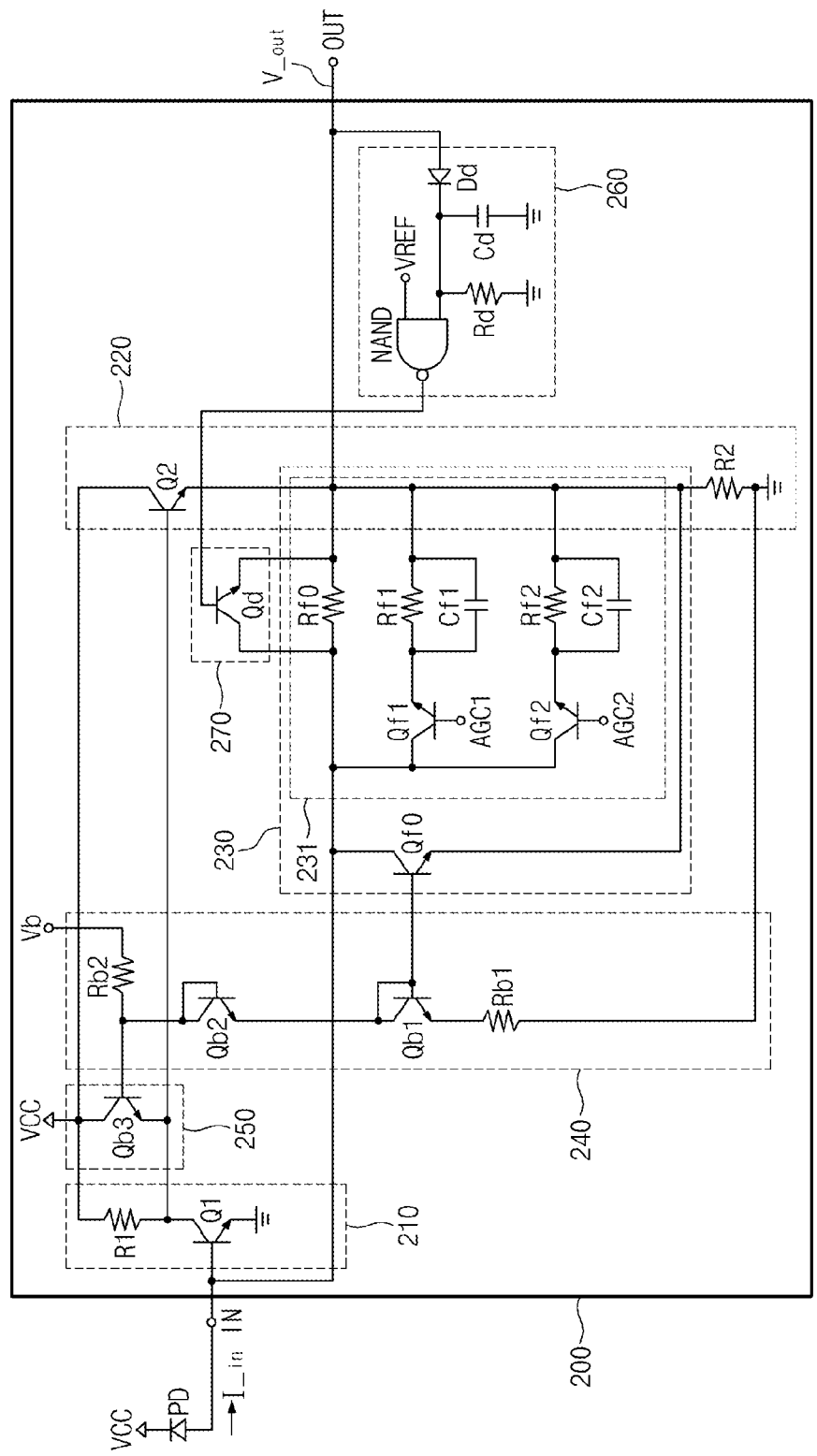
FIG. 2 is a view of a feedback amplifier according to an embodiment of the present invention.

FIG. 2 is a view of a feedback amplifier according to an embodiment of the present invention.

Referring to FIG. 2, a second feedback amplifier 200 is connected between an input terminal IN and an output terminal OUT. The input terminal IN is connected to a light receiving device connected to a power, that is, a PD. An input current I_in corresponding to a cathode current of the PD is supplied to the input terminal N.

The second feedback amplifier 200 includes a first amplification circuit unit 210, a second amplification circuit unit 220, a feedback circuit unit 230, a bias circuit unit 240, a phase compensation circuit unit 250, a first packet signal detection unit 260, and a second packet signal detection unit 270.

The first amplification circuit unit 210 and the second amplification circuit unit 220 amplify an input signal (that is, a burst packet input signal) inputted from the input terminal IN and generate an output signal. Here, the input signal may be current and the out signal may be voltage.

The first amplification circuit unit 210 includes a first NPN transistor Q1 (hereinafter, an NPN transistor is referred to as a transistor) and a first resistor R1.

The base of the first transistor Q1 is connected to the input terminal IN. The collector of the first transistor Q1 is connected to a power VCC through the first resistor R1. The emitter of the first transistor Q1 is connected to a ground terminal.

The second amplification circuit unit 220 includes a second transistor Q2 and a second resistor R2.

The base of the second transistor Q2 is connected to the collector of the first transistor Q1 and its collector is connected to the power VCC. The emitter of the second transistor Q2 is connected to the ground terminal through the second resistor R2 and is connected to the output terminal OUT.

The feedback circuit 230 includes a feedback transistor Qf0 and a feedback resistance unit 231. The feedback resistance unit 231 is connected in parallel to the feedback transistor Qf0. The feedback resistance unit 231 is connected to the input terminal IN, the output terminal OUT, and the second packet signal detection unit 270. In the feedback resistance unit 231, the total resistance value is determined by at least one control signal.

The feedback resistance unit 231 includes a fixed resistor Rf0, a first feedback resistor Rf1, a second feedback resistor Rf2, a first switch transistor Qf1, a second switch transistor Qf2, a first capacitor Cf1, and a second capacitor Cf2. Here, the first capacitor Cf1 and the second capacitor Cf2 may be selectively included.

The fixed resistor Rf0 is connected between the input terminal IN and the output terminal OUT.

Each of the first feedback resistor Rf1 and the second feedback resistor Rf2 is connected in parallel to the fixed resistor Rf0 on the basis of the fixed resistor Rf0.

The first switch transistor Qf1 is connected in series to the first feedback resistor Rf1. A first control signal AGC1 is applied to the base of the first switch transistor Qf1. The emitter of the first switch transistor Qf1 is connected to the first feedback resistor Rf1, and the collector of the first switch transistor Qf1 is connected to the fixed resistor Rf0. The first switch transistor Qf1 serves as a switch to turn on or off in response to the first control signal AGC1.

The second switch transistor Qf2 is connected in series to the second feedback resistor Rf2. A second control signal AGC2 is applied to the base of the second switch transistor Qf2. The emitter of the second switch transistor Qf2 is connected to the second feedback resistor Rf2, and the collector of the second switch transistor Qf2 is connected to the fixed resistor Rf0. The second switch transistor Qf2 serves as a switch to turn on or off in response to the second control signal AGC2.

The first and second control signals AGC1 and AGC2 are applied to the first switch transistor Qf1 and the second switch transistor Qf2 so as to control the first feedback resistor Rf1 and the second feedback resistor Rf2 to selectively connect in parallel to the fixed resistor Rf0. For example, when the first transistor Qf1 is turned on by the first control signal AGC1 and the second transistor Qf2 is turned off by the second control signal AGC2, only the first feedback resistor Rf1 is connected in parallel to the fixed resistor Rf0. At this point, a total resistance value of the feedback resistance unit 231 becomes $(Rf0 \cdot Rf1)/(Rf0+Rf1)\Omega$.

As a total resistance value of the feedback resistance unit 231 is reduced when the first feedback resistor Rf1 and the second feedback resistor Rf2 are connected in parallel to the fixed resistor Rf0, the frequency response of the second feedback amplifier 200 has a peak value. However, in order to improve the performance of the second feedback amplifier 200, it is necessary to flatten the frequency response. Accordingly, the first capacitor Cf1 may be connected in parallel to the first feedback resistor Rf1 and the second feedback capacitor Cf2 may be connected in parallel to the second feedback resistor Rf2, in order to compensate for the frequency response of the second feedback amplifier 200 due to the reduction of the total resistance value of the feedback resistance unit 231.

The first feedback capacitor Cf1 and the second feedback capacitor Cf2 compensate for a frequency response due to the reduction of a total feedback resistance value.

The collector of the feedback transistor Qf0 is connected to the input terminal IN, and its emitter is connected to the output terminal OUT. A bias voltage is applied to the base of the feedback transistor Qf0. The feedback transistor Qf0 may adjust gain according to a bias voltage.

The bias circuit unit 240 applies bias voltage to the feedback transistor Qf0. The bias circuit unit 240 includes a first bias transistor Qb1, a second bias transistor Qb2, a first bias resistor Rb1 and a second bias resistor Rb2.

In the first bias transistor Qb1, the base and the collector are commonly connected. The commonly connected base and collector of the first bias transistor Qb1 are connected to the feedback transistor Qf0. The emitter of the first bias transistor Qb1 is connected to a ground terminal through the first bias resistor Rb1.

One end of the first bias resistor Rb1 is connected to the emitter of the first bias transistor Qb1, and the other end is connected to the ground terminal.

In the second bias transistor Qb2, the base and the collector are commonly connected, and the emitter is connected to the collector of the first bias transistor Qb1.

One end of the second bias resistor Rb2 is connected to the collector of the second bias transistor Qb2, and a bias voltage Vb is applied to the other end.

The phase compensation circuit unit 250 prevents the distortion of an output waveform due to the increase of an amount in feedback current. The phase compensation circuit unit 250 includes a compensation transistor Qb3. The collector of the compensation transistor Qb3 is connected to the power VCC, and its emitter is connected to the collector of the first transistor Q1. The base of the compensation transistor Qb3 is connected to the second bias resistor Rb2. Here, the phase compensation circuit unit 250 may be selectively included in the second feedback amplifier 200.

The first packet signal detection unit 260 detects the peak value of a burst packet signal from the output terminal OUT. The first packet signal detection unit 260 includes a detection diode Dd, a detection capacitor Cd, a detection resistor Rd, and a detection NAND gate NAND.

The detection diode Dd is connected to the output terminal OUT, and detects a peak value with an output signal through the output terminal OUT. The detection diode Dd outputs the detected peak value as one of the inputs of the detection NAND gate NAND.

One end of the detection capacitor Cd is connected to the contact point of the detection diode Dd and the input of the NAND gate NAND. Moreover, the other end of the detection capacitor Cd is connected to the ground terminal.

One end of the detection resistor Rd is connected to the contact point of the detection diode Dd and the input of the NAND gate NAND. Moreover, the other end of the detection resistor Rd is connected to the ground terminal.

The detection NAND gate NAND performs a NAND operation with a detection reference voltage VREF and an output of the detection diode Dd. The detection NAND gate NAND outputs a NAND operation result to the second packet signal detection unit 270.

The second packet signal detection unit 270 turns on/off the fixed resistor Rf0 between the input terminal IN and the output terminal OUT according to a peak value detected through the first packet signal detection unit 260. The second packet signal detection unit 270 includes a detection transistor Qd.

The base of the detection transistor Qd is connected to an output of the detection NAND gate NAND and receives a NAND operation result. The collector of the detection transistor is connected to the input terminal IN, and the emitter of the detection transistor Qd is connected to the output terminal OUT. That is, the detection transistor Qd is connected in parallel to the fixed resistor Rf0. The fixed resistor Rf0 may be applied or removed by an on/off operation of the detection transistor Qd.

In relation to the second feedback amplifier 200 having the above configuration, an operation for detecting the peak value of a burst packet signal and adjusting an automatic gain of the detected burst packet signal is described below.

The first packet signal detection unit 260 detects the peak value of a burst packet signal from the output terminal OUT. At this point, the detection diode Dd detects the peak value of a burst packet signal from the output terminal OUT. The detection capacitor Cd and the detection resistor Rd maintain the peak value of the detected burst packet signal. Here, the detection NAND gate NAND receives the burst packet signal having the maintained peak value through one of the inputs.

Only when signals inputted through two inputs are high signals (i.e., signals in a high state), the detection NAND gate NAND outputs low signals (i.e., signals in a low state). Accordingly, the detection NAND gate NAND receives a signal detected from the detection diode Dd and a reference voltage VREF so as to generate a low signal.

Moreover, the detection NAND gate NAND generates a high signal if a peak value is not detected and a reference voltage VREF is not applied.

The second packet signal detection unit 270 controls whether to apply the fixed resistance value of the fixed resistor Rf0 on the basis of a signal outputted from the first packet signal detection unit 260.

On receiving a low signal, the detection transistor Qd turns off its operation to apply the fixed resistance value of the fixed resistor Rf0. That is, the detection transistor Qd maintains a fixed resistance value.

On the contrary, on receiving a high signal, the detection transistor Qd turns on its operation not to apply the fixed resistance value of the fixed resistor Rf0 to an output signal. That is, the detection transistor Qd removes a fixed resistance value. Through this, the detection transistor Qd does not operate the second feedback amplifier 200.

The feedback resistance unit 231 may change the size of a fixed resistance value of the fixed resistor Rf0 according to the first control signal AGC1 and the second control signal AGC2.

When the detection transistor Qd is turned off to maintain a fixed resistance value and the second feedback amplifier 200 operates, the two feedback transistors Qf1 and Qf2 of the feedback resistance unit 231 receive the first control signal AGC1 and the second control signal AGC2, respectively, through the base and operates as a switch.

When the first feedback transistor Qf1 and the second feedback transistor Qf2 are turned off by the first control signal AGC1 and the second control signal AGC2, an output signal may obtain a high gain by applying only a resistance value of the fixed resistor Rf0.

When the first feedback transistor Qf1 is turned on by the first control signal AGC1 and the second feedback transistor Qf2 is turned off by the second control signal AGC2, the first feedback resistor Rf1 is connected in parallel to the fixed resistor Rf0. At this point, a total resistance value is reduced by the feedback resistance value of the first feedback resistor Rf1 and obtains a low gain. Here, a total resistance value is less than the fixed resistance value of the fixed resistor Rf0.

On the contrary, when the first feedback transistor Qf1 is turned off by the first control signal AGC1 and the second feedback transistor Qf2 is turned on by the second control signal AGC2, the second feedback resistor Rf2 is connected in parallel to the fixed resistor Rf0. At this point, a total resistance value is reduced by the feedback resistance value of the second feedback resistor Rf2 and obtains a low gain. Here, a total resistance value is less than the fixed resistance value of the fixed resistor Rf0.

Some of the fixed resistor Rf0, the first feedback resistor Rf1, and the second feedback resistor Rf2 may have the same value, or all of them may have different values. Through this, a gain applied to an output signal may be controlled.

Since the feedback transistor Qf0 of the feedback circuit unit 230 is connected to the base of the first bias transistor Qb1 of the bias circuit unit 240, an operation of the feedback transistor Qf0 is fixed by the bias voltage Vb provided from the bias circuit unit 240. That is, an impedance between the collector and emitter of the feedback transistor Qf0 is adjusted by a voltage level of the output terminal OUT determined by the bias voltage Vb.

Accordingly, if the input current I_in is sufficiently reduced, the voltage level of the output terminal OUT almost does not deviate from an operating point (Q-pint) or a DC level. Therefore, when the feedback transistor Qf0 is in a turn-off state, a state between the collector and emitter of the feedback transistor Qf0 is regarded as an open state. As a result, the feedback circuit unit 230 includes only the resistor of the feedback resistance unit 231 and serves to perform almost the same operation as a feedback amplifier having no automatic gain control function. Accordingly, a voltage of the output terminal OUT is almost identical to the product of the total resistance value of the feedback resistance unit 231 and the input current I_in.

Unlike this, if the input current I_in is sufficiently increased, as the voltage level of the output terminal OUT becomes gradually lower than the operating point Q-point, the feedback transistor Qf0 is turned on. Accordingly, the feedback transistor Qf0 is conducted so that an impedance between the collector and emitter thereof is reduced. Additionally since an entire impedance of the feedback circuit unit 230 is reduced, a gain of the second feedback amplifier 200 is reduced. That is, the second feedback amplifier 200 performs an automatic gain adjustment operation.

When such an automatic gain adjustment operation is described in more detail, since the base of the first bias transistor Qb1 is connected to the base of the feedback transistor Qf0, a voltage of a diode turn-on voltage level is applied to the base of the feedback transistor Qf0.

Since the collector of the feedback transistor Qf0 is connected to the base of the first transistor Q1, a DC voltage of a diode turn-on voltage level is applied to the collector of the feedback transistor Qf0. Accordingly, a DC voltage of a similar voltage is applied to the base and collector of the feedback transistor Qf0. When the input current I_in is increased in a DC state (i.e., an operating point state), a voltage of the output terminal OUT is reduced by inverted amplification.

Here, not connecting the base and collector of the feedback transistor Qf0 is to adjust a turn-on voltage of the feedback transistor Qf0 with the bias voltage Vb.

Since the feedback resistance unit 231 and the feedback transistor Qf0 is connected in parallel to each other, it is assumed that a total resistance value of the feedback resistance unit 231 is Rf and a turn-on resistance value of the feedback transistor is RQf. At this point, a total feedback impedance Zf of the feedback circuit unit 230 is expressed as the following Equation 1.

$$Zf=Rf\|RQf \quad \text{[Equation 1]}$$

Here, when the input voltage I_in is increased, as the turn-on resistance RQf of the feedback transistor Qf0 is reduced, and the total feedback impedance Zf is also reduced.

Also, a gain of the feedback circuit unit 230 is expressed as the following Equation 2.

$$gain=V\_out/I\_in=-Zf \quad \text{[Equation 2]}$$

Since the gain of the feedback circuit unit 230 becomes a negative feedback impedance Zf, as the input current I_in is increased, the gain of the second feedback amplifier 200 is reduced.

At this point, as an automatic gain adjustment operation starts, the size of the minimum input current I_in is determined by a voltage applied to the base of the feedback transistor Qf0. Therefore, the desired size of the minimum input current I_in may be set through the adjustment of the bias voltage Vb.

As a result, the base voltage of the feedback transistor Qf0 is fixed by a voltage supplied from the bias circuit unit 240. Also, since an impedance size between the collector and emitter of the feedback transistor Qf0 is automatically adjusted by a voltage level of the output terminal OUT connected to the emitter of the feedback transistor Qf0, an additional gain control signal generating circuit is not necessary. Moreover, since the impedance of the feedback circuit unit 200 is reduced as the input current I_in is increased, a gain of the second feedback amplifier 200 is automatically adjusted.

Moreover, the first amplification circuit unit 210 and the second amplification circuit unit 220 are regarded as one amplification circuit unit, and the first packet signal detection unit 260 and the second packet signal detection unit 270 are regarded as one packet signal detection unit.

The second feedback amplifier 200 determines a total resistance value of the feedback resistance unit 231 by an on/off operation of the first switch transistor Qf1 and the second switch transistor Qf2 in response to the first control signal AGC1 and the second control signal AGC2. In such a state, as the input current I_in is increased, since an impedance of the feedback circuit unit 230 is reduced, a gain may be adjusted. Therefore, even when a difference between input signals is great, a gain may be freely adjusted.

Figure 3:
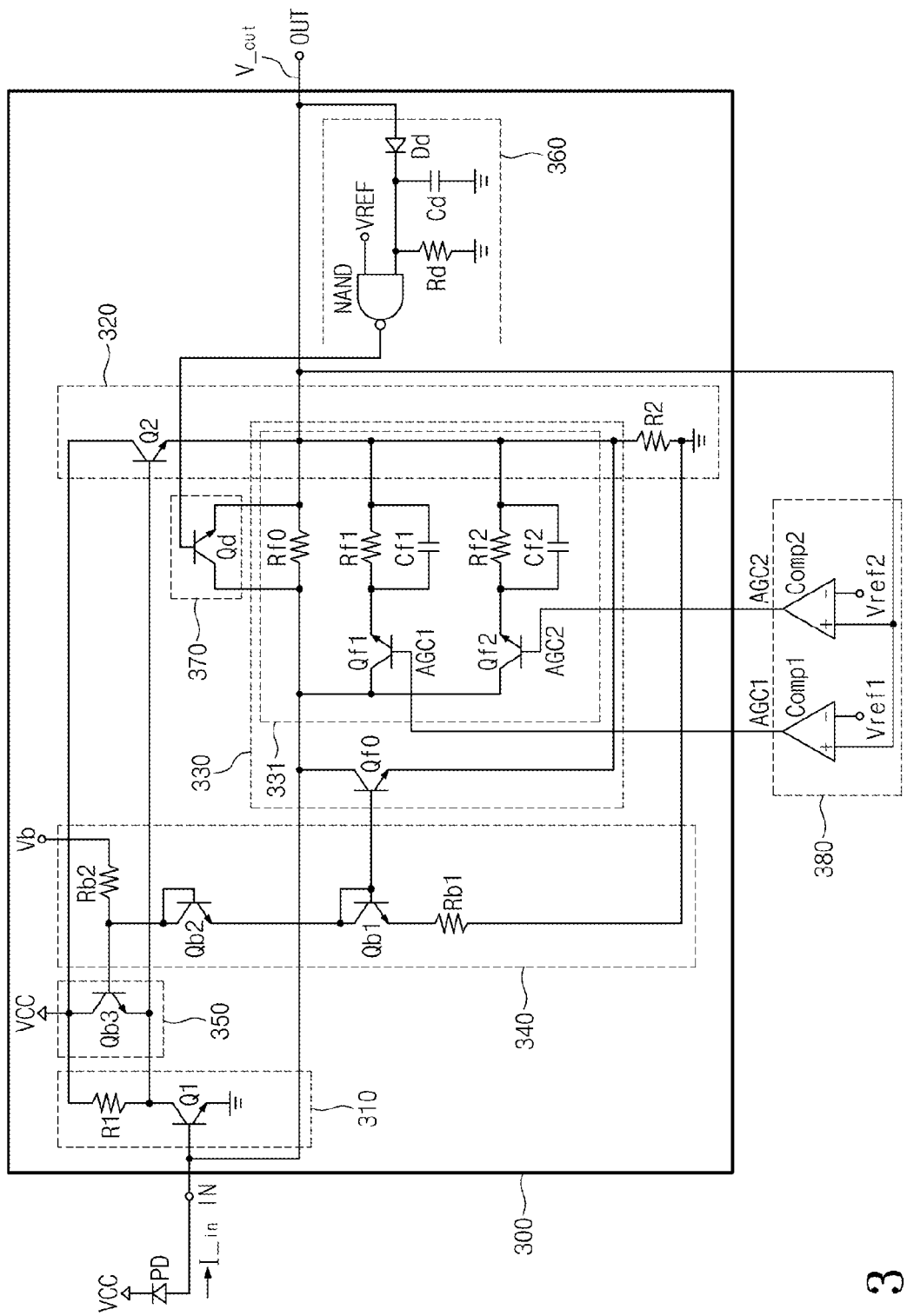
FIG. 3 is a view of a feedback amplifier according to another embodiment of the present invention.

FIG. 3 is a view of a feedback amplifier according to another embodiment of the present invention.

Referring to FIG. 3, a third feedback amplifier 300 is connected between an input terminal IN and an output terminal OUT. The input terminal IN is connected to a light receiving device connected to a power, that is, a PD. An input current I_in corresponding to a cathode current of the PD is supplied to the input terminal N.

The third feedback amplifier 300 includes a first amplification circuit unit 310, a second amplification circuit unit 320, a feedback circuit unit 330, a bias circuit unit 340, a phase compensation circuit unit 350, a first packet signal detection unit 360, a second packet signal detection unit 370, and a control signal generating unit 380.

The third feedback amplifier 300 has a similar structure to the second feedback amplifier 200. However, the third feedback amplifier 300 further includes the control signal generating unit 380 compared to the second feedback amplifier 200. Accordingly, the components of the third feedback amplifier 300 except for the control signal generating unit 380 will not described again with reference to FIG. 2.

Here, the control signal generating unit 380 includes a first comparator Comp1 and a second comparator Comp2.

The first comparator Comp1 receives a first comparison reference voltage Vref1 through a negative input and receives an output voltage V_out of the output terminal OUT through a positive input. As one example, when the output voltage V_out has a greater value than the first comparison reference voltage Vref1, the first control signal AGC1 turns on the first feedback transistor Qf1 (i.e., outputs a signal in a high state). When the output voltage V_out has a less value than the first comparison reference voltage Vref1, the first control signal AGC1 turns off the first feedback transistor Qf1 (i.e., outputs a signal in a low state).

The second comparator Comp2 receives a second comparison reference voltage Vref2 through a negative input and receives an output voltage V_out of the output terminal OUT through a positive input. As one example, when the output voltage V_out has a greater value than the second comparison reference voltage Vref2, the second control signal AGC2 turns on the second feedback transistor Qf2. When the output voltage V_out has a less value than the second comparison reference voltage Vref2, the second control signal AGC2 turns off the second feedback transistor Qf2.

In this way, the control signal generating unit 380 may generate the first control signal AGC1 and the second control signal AGC2 on the basis of the output voltage V_out of the output terminal OUT.

Figure 4:
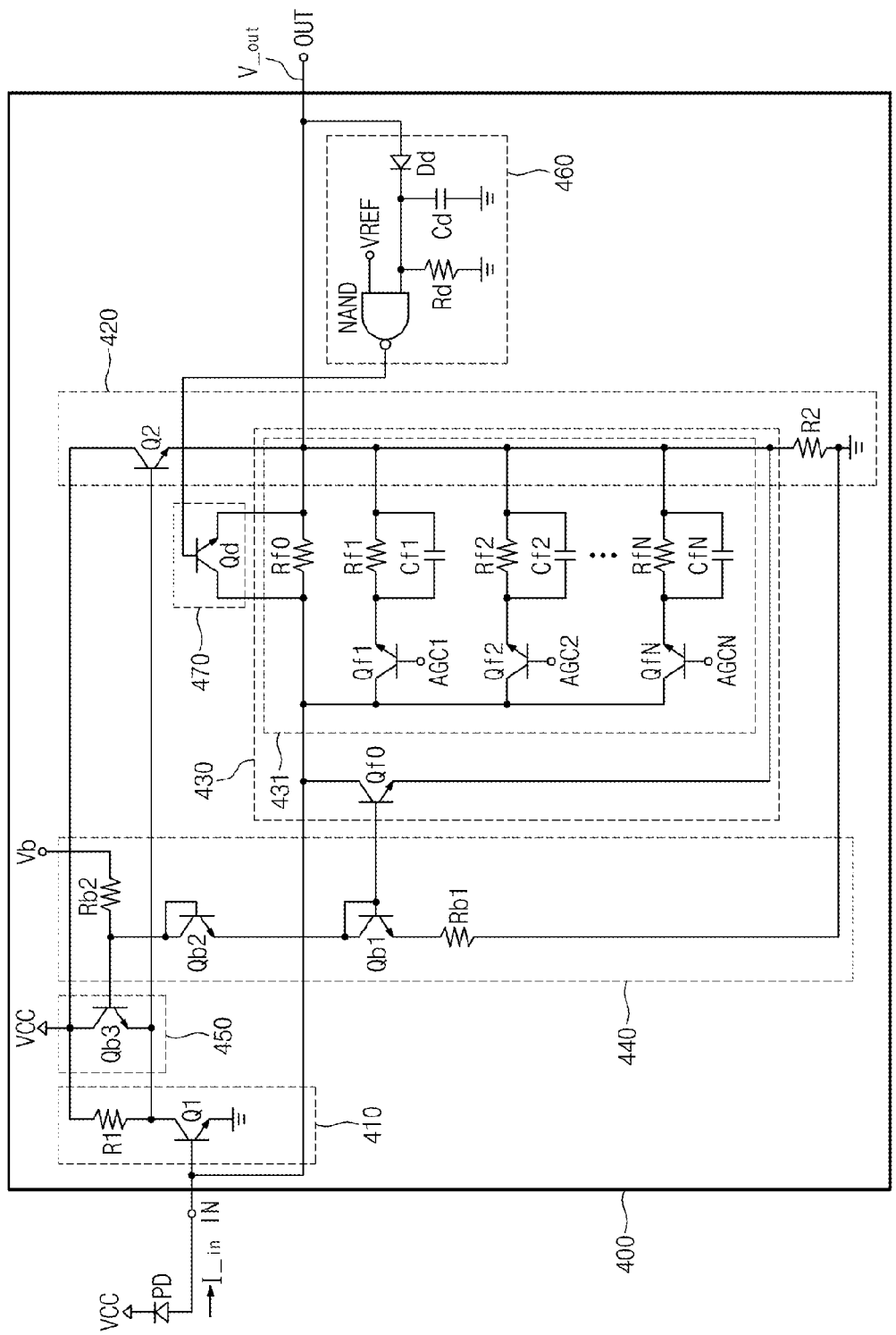
FIG. 4 is a view of a feedback amplifier according to another embodiment of the present invention.

FIG. 4 is a view of a feedback amplifier according to another embodiment of the present invention.

Referring to FIG. 4, a fourth feedback amplifier 400 is connected between an input terminal IN and an output terminal OUT. The input terminal IN is connected to a light receiving device connected to a power, that is, a PD. An input current I_in corresponding to a cathode current of the PD is supplied to the input terminal N.

The fourth feedback amplifier 400 includes a first amplification circuit unit 410, a second amplification circuit unit 420, a feedback circuit unit 430, a bias circuit unit 440, a phase compensation circuit unit 450, a first packet signal detection unit 460, and a second packet signal detection unit 470.

The fourth feedback amplifier 400 has a similar structure to the second feedback amplifier 200. However, the fourth feedback amplifier 400 has a different structure of a feed resistance unit 431 in the feedback circuit unit 430 than the second feedback amplifier 200. Accordingly, the components of the fourth feedback amplifier 400 except for the feedback resistance unit 431 will not described again with reference to FIG. 2.

The feedback resistance unit 431 includes N feedback resistors Rf1 to RfN, N feedback transistors Qf1 to QfN respectively connected in series to the N feedback resistors Rf1 to RfN, and N feedback capacitors Cf1 to CfN respectively connected in parallel to the N feedback resistors Rf1 to RfN.

Due to this, the N feedback transistors Qf1 to QfN may operate in response to each of N control signals AGC1 to AGCN, and may change a fixed resistance value of the fixed resistor Rf0.

Here, some of the N feedback resistors may have the same value or all of them may have different values.

Figure 5:
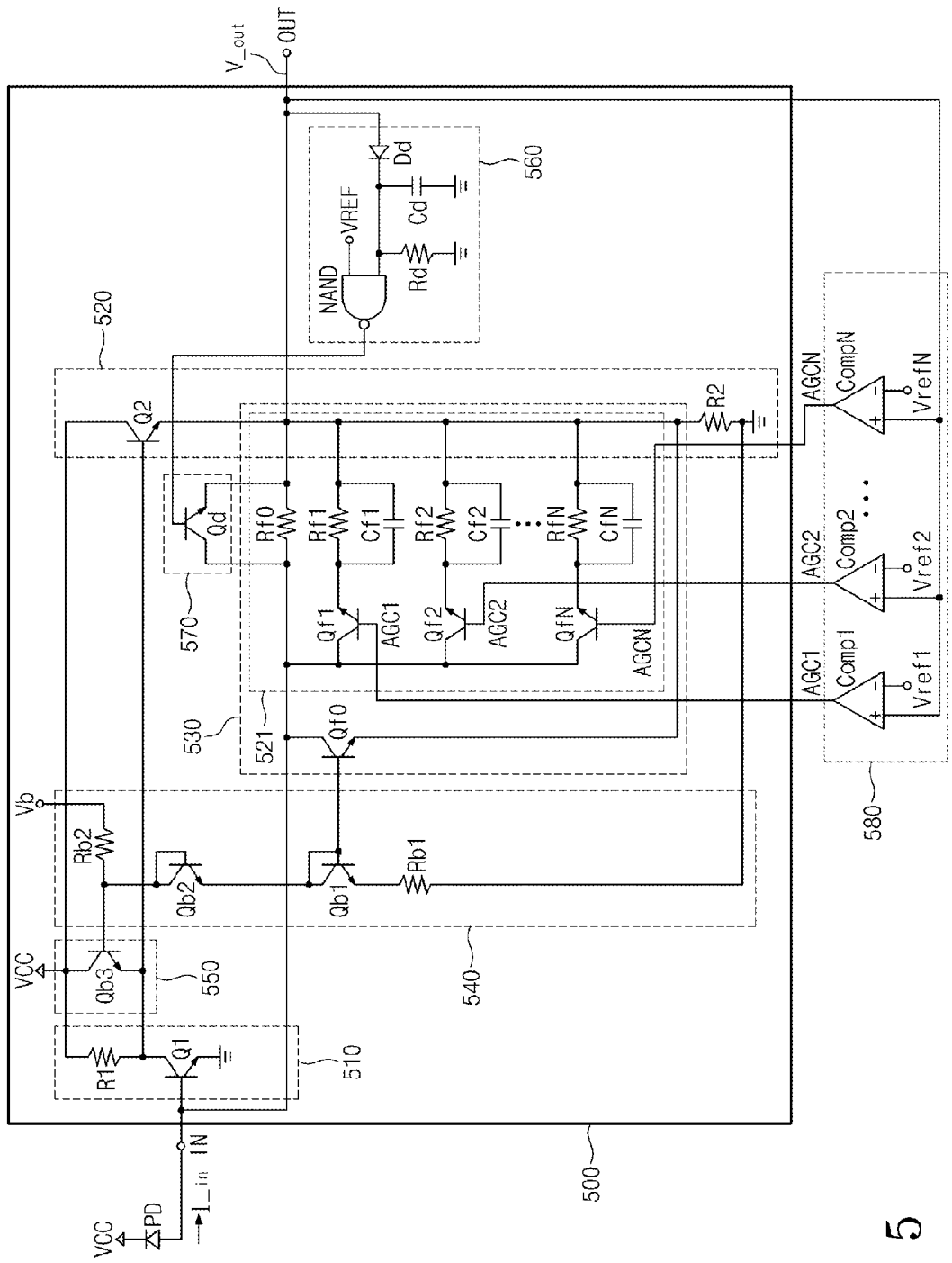
FIG. 5 is a view of a feedback amplifier according to another embodiment of the present invention.

FIG. 5 is a view of a feedback amplifier according to another embodiment of the present invention.

Referring to FIG. 5, a fifth feedback amplifier 500 is connected between an input terminal IN and an output terminal OUT. The input terminal IN is connected to a light receiving device connected to a power, that is, a photo diode (PD). An input current I_in corresponding to a cathode current of the PD is supplied to the input terminal N.

The fifth feedback amplifier 500 includes a first amplification circuit unit 510, a second amplification circuit unit 520, a feedback circuit unit 530, a bias circuit unit 540, a phase compensation circuit unit 550, a first packet signal detection unit 560, a second packet signal detection unit 570, and a control signal generating unit 580.

The fifth feedback amplifier 500 has a similar structure to the fourth feedback amplifier 400. However, the fifth feedback amplifier 500 further includes the control signal generating unit 580 compared to the fourth feedback amplifier 400. Accordingly, the components of the fifth feedback amplifier 500 except for the control signal generating unit 580 will not described again with reference to FIG. 4.

The control signal generating unit 580 includes a first comparator Comp1, a second comparator Comp2 . . . an Nth comparator CompN.

The first comparator Comp1 receives a first comparison reference voltage Vref1 through a negative input and receives an output voltage V_out of the output terminal OUT through a positive input. As one example, when the output voltage V_out has a greater value than the first comparison reference voltage Vref1, the first control signal AGC1 turns on the first feedback transistor Qf1. When the output voltage V_out has a less value than the first comparison reference voltage Vref1, the first control signal AGC1 turns off the first feedback transistor Qf1.

The second comparator Comp2 receives a second comparison reference voltage Vref2 through a negative input and receives an output voltage V_out of the output terminal OUT through a positive input. As one example, when the output voltage V_out has a greater value than the second comparison reference voltage Vref2, the second control signal AGC2 turns on the second feedback transistor Qf2. When the output voltage V_out has a less than the second comparison reference voltage Vref2, the second control signal AGC2 turns off the second feedback transistor Qf2.

The Nth comparator CompN receives an Nth comparison reference voltage VrefN through a negative input and receives an output voltage V_out of the output terminal OUT through a positive input. As one example, when the output voltage V_out has a greater value than the Nth comparison reference voltage VrefN, the Nth control signal AGCN turns on the Nth feedback transistor QfN. When the output voltage V_out has a less value than the Nth comparison reference voltage VrefN, the Nth control signal AGCN turns off the Nth feedback transistor QfN.

In this way, the control signal generating unit 580 may generate the first control signal AGC1 to the Nth control signal AGCN on the basis of the output voltage V_out of the output terminal OUT.

Although the above-mentioned feedback amplifiers 200, 300, 400, and 500 include two or a plurality of feedback resistors in a feedback resistance unit, they may be applied to all structures including at least one feedback resistor.

In this way, the feedback amplifiers 200, 300, 400, and 500 suggested by the present invention control the resistance values of the feedback circuit units 230, 330, 430, and 530 through an output signal or a control signal. Through this, the feedback amplifiers 200, 300, 400, and 500 controls a gain through a control of a resistance value of a feedback circuit unit by detecting an output signal, detects a small size of an input signal, and adjusts a gain even when a difference between input signals is great.

Through this, a feedback amplifier according to an embodiment of the present invention relates to a feedback amplifier used as a preamplifier of an optical communication system, and may be applied to an optical receiver.

According to an embodiment of the present invention, a feedback amplifier may detect a small size of an input signal through a control of a feedback resistance value in response to an output signal and a control signal. Additionally, according to an embodiment of the present invention, even when a difference between input signals is great, a feedback amplifier may adjust a gain by changing an impedance value of a feedback resistor to control a gain as an input current is increased.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A feedback amplifier comprising:
an amplification circuit unit amplifying a burst packet signal inputted from an input terminal and outputting the amplified voltage to an output terminal;
a feedback circuit unit disposed between the input terminal and the output terminal and controlling whether to apply a fixed resistance value to a signal outputted to the output terminal;
a packet signal detection unit detecting a peak value of a burst packet signal from the output terminal and controlling whether to apply the fixed resistance value; and
a bias circuit unit generating a bias voltage,
wherein the feedback circuit unit determines a feedback resistance value to change the fixed resistance value in response to at least one control signal and adjusts a gain by receiving the bias voltage;
wherein the feedback circuit unit comprises:
a feedback transistor where a base receives the bias voltage, a collector is connected to the input terminal, and an emitter is connected to the output terminal; and
a feedback resistance unit connected in parallel to the feedback transistor;
wherein the feedback resistance unit comprises:
a fixed resistor connected between the input terminal and the output terminal; and
at least one feedback resistor connected in parallel to the fixed resistor; and
wherein the packet signal detection unit comprises:
a detection diode detecting a peak value of a burst packet signal of the output node:
a detection NAND gate receiving the detected peak value and a detection reference voltage and outputting a NAND operation result through a NAND operation; and a detection transistor in parallel to the fixed resistor and performs one of an on operation and an off operation according to the NAND operation result to control the fixed resistance value.

2. The feedback amplifier of claim 1, further comprising at least one switch transistor connected in series to the feedback resistor and selectively connecting a feedback resistor in parallel to the fixed resistor through a turn on/off operation in response to a control signal inputted through a base.

3. The feedback amplifier of claim 1, wherein the feedback resistance unit is connected in parallel to the at least one feedback resistor to compensate for a frequency response.

4. The feedback amplifier of claim 1, wherein the packet signal detection unit comprises:
   a detection capacitor connected between an output the detection diode and a ground terminal to maintain the detected peak value; and
   a detection resistor connected between the output of the detection diode and the ground terminal to maintain the detected peak value.

5. The feedback amplifier of claim 1, wherein the bias circuit unit comprises:
   a first bias resistor connected to a ground terminal;
   a first bias transistor where a base and a collector are commonly connected to the base of the feedback transistor to provide the bias voltage, and an emitter is connected to the ground terminal through the first bias resistor; and
   a second bias transistor receiving the bias voltage; and
   a second bias transistor where an emitter is connected to the collector of the first bias transistor, a base is connected to the collector, and the collector is connected to the second bias resistor.

6. The feedback amplifier of claim 5, wherein the amplification circuit unit comprises:
   a first resistor connected to a power supply voltage;
   a first transistor where a base is connected to the input terminal, an emitter is connected to a ground terminal, and a collector is connected to the power supply voltage through the first resistor;
   a second transistor where a base is connected to the collector of the first transistor, a collector is connected to the power supply voltage, and an emitter is connected to the output terminal; and
   a second resistor connected between the output terminal and the ground terminal.

7. The feedback amplifier of claim 6, further comprising a phase compensation circuit unit preventing a distortion of an output waveform according to an increase of an amount in feedback current, between the amplification circuit unit and the bias circuit unit.

8. The feedback amplifier of claim 7, wherein the phase compensation circuit unit comprises a compensation transistor where a collector is connected to a power supply voltage, a base is connected to the collector of the second bias transistor, and an emitter is connected to the collector of the first transistor.

9. The feedback amplifier of claim 1, further comprising a control signal generating unit generating the at least one control signal on the basis of a comparison result of an output voltage of the output terminal and a comparison reference voltage.

10. The feedback amplifier of claim 9, wherein the control signal generating unit comprises at least one comparator receiving the output voltage of the output terminal and the comparison reference voltage, generating a control signal in a high state when the output voltage is greater than the comparison reference voltage, and generating the control signal in a low state when the output voltage is less than the comparison reference voltage.

* * * * *